(12) United States Patent
Okuuchi et al.

(10) Patent No.: US 7,955,440 B2
(45) Date of Patent: Jun. 7, 2011

(54) METHOD FOR CLEANING SILICON WAFER AND APPARATUS FOR CLEANING THE SILICON WAFER

(75) Inventors: Shigeru Okuuchi, Tokyo (JP);
Kazushige Takaishi, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/746,201

(22) PCT Filed: Nov. 21, 2008

(86) PCT No.: PCT/JP2008/071198
§ 371 (c)(1),
(2), (4) Date: Jun. 4, 2010

(87) PCT Pub. No.: WO2009/072406
PCT Pub. Date: Jun. 11, 2009

(65) Prior Publication Data
US 2010/0252070 A1    Oct. 7, 2010

(30) Foreign Application Priority Data
Dec. 7, 2007 (JP) .................. 2007-317621

(51) Int. Cl.
*C23G 1/02* (2006.01)

(52) U.S. Cl. ......... 134/2; 134/3; 134/5; 134/11; 134/19; 134/21; 134/25.1; 134/25.4; 134/26; 134/28; 134/30; 134/32; 134/34; 134/35; 134/36; 134/41; 134/42; 134/902; 134/94.1; 134/99.1; 134/184; 438/706; 438/745; 438/778; 438/906; 438/928; 257/E21.219; 257/E21.224; 257/E21.228; 257/E21.229; 216/58; 216/79; 216/80; 216/83; 216/96; 216/97; 216/98; 216/99

(58) Field of Classification Search ............ 134/2, 3, 134/5, 11, 19, 21, 25.1, 25.4, 26, 28, 30, 134/32, 34, 35, 36, 41, 42, 902, 94.1, 99.1, 134/184; 216/58, 79–80, 83, 96–99; 438/706, 438/778, 745, 906, 928; 257/E21.219, E21.224, 257/E21.228, E21.229
See application file for complete search history.

(56) References Cited

U.S. PATENT DOCUMENTS
5,078,832 A    1/1992    Tanaka
(Continued)

FOREIGN PATENT DOCUMENTS

| JP | 3-80538 | 4/1991 |
|---|---|---|
| JP | 9-293701 | 11/1997 |
| JP | 2002-299300 | 10/2002 |

OTHER PUBLICATIONS

International Search Report for PCT/JP2008/071198, mailed Dec. 22, 2008.

*Primary Examiner* — Sharidan Carrillo
(74) *Attorney, Agent, or Firm* — Greenblum & Bernstein, P.L.C.

(57) ABSTRACT

After a water film is formed on a wafer front surface in a chamber, the water film is supplied sequentially with an oxidizing component of an oxidation gas, an organic acid component of an organic acid mist, an HF component of an HF gas, the organic acid mist, and the oxidizing component of the oxidation gas. As a result, the HF component and the organic acid component provide cleaning effect on the wafer surface, and a concentration of the cleaning components in the water film within a wafer surface can be even.

4 Claims, 3 Drawing Sheets

U.S. PATENT DOCUMENTS

| | | | |
|---|---|---|---|
| 5,837,662 A * | 11/1998 | Chai et al. | 510/175 |
| 5,896,875 A * | 4/1999 | Yoneda | 134/102.3 |
| 5,922,624 A * | 7/1999 | Verhaverbeke et al. | 438/743 |
| 6,235,645 B1 * | 5/2001 | Habuka et al. | 438/758 |
| 6,431,186 B1 * | 8/2002 | Morita et al. | 134/1.3 |
| 6,699,330 B1 * | 3/2004 | Muraoka | 134/3 |
| 6,743,301 B2 * | 6/2004 | Matsuno et al. | 134/3 |

* cited by examiner

First embodiment    Comparative example 1    Comparative example 2

METHOD FOR CLEANING SILICON WAFER AND APPARATUS FOR CLEANING THE SILICON WAFER

BACKGROUND OF THE INVENTION

1. Field of the Invention

The present invention relates to a method of cleaning a silicon wafer and an apparatus for cleaning the same. More specifically, the present invention relates to a method of cleaning a silicon wafer, in which a water film is formed on a surface of a silicon wafer in a chamber, and then the surface of the silicon wafer is cleaned by dissolving a cleaning component of a predetermined cleaning gas into the water film. The present invention also relates to an apparatus for cleaning the silicon wafer.

2. Description of Related Art

In a variety of wafer processes, metal impurities and microparticles (particles) having a particle size of 1 μm or less are deposited on a front surface of a silicon wafer, and process damages are formed. With increasingly high integration and high functionality of semiconductor devices, it is demanded that a front surface of a semiconductor substrate be free from contamination due to metal impurities and microparticles, and that no process damage be formed. Thus, silicon wafer cleaning technology is extremely important.

An example of a conventional method of cleaning a semiconductor substrate is a "method of manufacturing a semiconductor," as disclosed in Related Art 1. In the method, while deionized water is first continuously supplied to a front surface of a rotating silicon wafer in a single-wafer type chamber, the deionized water is contacted with anhydrous hydrogen fluoride gas, hydrochloric gas, ozone, or a mixture thereof. Thereby, cleaning components, such as anhydrous hydrogen fluoride and the like, are dissolved in the flowing deionized water, and thus the silicon wafer after being etched is cleaned.

Related Art 1: Japanese Patent Laid-open Publication No. H9-293701

In the method of cleaning the silicon wafer disclosed in Related Art 1, the deionized water as flowing water is contacted with wafer cleaning gas, such as anhydrous hydrogen fluoride gas and the like, on the front surface of the silicon wafer, as described above. Then, the cleaning components (anhydrous hydrogen fluoride and the like) in the gas are dissolved, and thus the etched silicon wafer is cleaned. The cleaning components in the cleaning gas dissolved in the deionized water is immediately discharged from the wafer front surface. As a result, cleaning effect of the cleaning components is not sufficient. Further, in the method as described above in which the water film of the flowing deionized water is used, a thickness of the water film within the wafer surface and a flow velocity of the deionized water are not stabilized. It is thus difficult to achieve an even concentration of the cleaning components within the wafer surface, and thus unevenness is caused in cleaning. The tendency has increased as a diameter of silicon wafers is larger. In addition, the cleaning components are supplied only in a gasified state.

SUMMARY OF THE INVENTION

The present invention provides a method of cleaning a silicon wafer and an apparatus for cleaning the silicon wafer, the method and apparatus achieving a sufficient cleaning effect of cleaning components in a gas and a mist, and being capable of providing an even concentration of the cleaning components in a water film within a wafer surface, and thus preventing unevenness in cleaning. The present invention also provides an apparatus for cleaning a silicon wafer capable of providing an organic acid mist in a simple and affordable manner.

A first aspect of the invention provides a method of cleaning a silicon wafer including forming a water film by supplying water to at least one of a front surface and a rear surface of a silicon wafer placed in a chamber; forming a silicon oxide film by introducing an oxidation gas to the chamber, acidifying the water film, and thereby causing an oxidation action on at least one of the front surface and the rear surface of the silicon wafer; negatively charging metal impurities and microparticles existing in the silicon oxide film by supplying an organic acid mist to the chamber subsequent to the forming of the oxide film; introducing gas by supplying an HF gas to the chamber subsequent to the forming of the oxide film, and thereby dissolving the silicon oxide film in the water film; discharging the water film from the surface of the silicon wafer on which the water film is formed, by introducing the organic acid mist to the chamber subsequent to the introducing of the gas, the water film containing a melt of the silicon oxide film; and forming a protection film by supplying water to the chamber subsequent to the discharging, and thereby forming a water film again on at least one of the front surface and the rear surface of the silicon wafer; and by supplying an oxidation gas to the chamber, dissolving a component of the oxidation gas in the water film, and thereby forming a silicon oxide film on at least one of the front surface and the rear surface of the silicon wafer.

According to the first aspect of the invention, the silicon wafer is placed in the chamber, and the water is supplied so as to form the water film at least on the front surface of the front and rear surfaces of the wafer. The oxidation gas is then introduced to the chamber; a component of the oxidation gas is dissolved in the water film; and thereby the silicon oxide film is formed on the surface of the silicon wafer on which the water film is formed. Subsequently, the organic acid mist and the HF gas are introduced into the chamber, instead of the oxidation gas. The organic acid mist and the HF gas may be introduced into the chamber concurrently or separately. In the latter case, the organic acid mist and the HF gas may be introduced in any order. Thereby, the organic acid in a mist form and the HF in a gas form are contacted with the water film, and thus respective components are dissolved in the water film. The organic acid in the mist form negatively charges the surface of the silicon wafer on which the water film is formed, and the metal impurities and the microparticles deposited on the surface. Zeta potential removes the metal impurities and the microparticles from the wafer surface. The metal impurities transferred to the water film form a complex with molecules of the organic acid. Complex ions of the metal complex salt are also negatively charged, similar to the surface potential of the silicon wafer. Thus, the metal complex transferred into the liquid is not deposited again on the silicon wafer whose surface potential is negative. Further, an etching function of the gasified HF dissolves the silicon oxide film, and thereby removes the film from the wafer surface.

The HF gas is stopped from being introduced into the chamber thereafter, for example, and only the organic acid mist is introduced. Then, while the status is maintained, the water film contaminated due to dissolution of the metal impurities, the microparticles, and the silicon oxide film, is discharged from the surface of the silicon wafer on which the water film is formed. Since the organic acid is continuously introduced to the water film at the time, it is unlikely that the metal impurities and the microparticles are deposited again on the wafer surface, because of the reasons described above. Then, the oxidation gas is introduced into the chamber in lieu of the organic acid mist; the component of the oxidation gas is dissolved in the organic acid water film; and thereby the silicon oxide protection film is formed on the surface of the silicon water on which the water film is formed.

The chamber may be a single-wafer type chamber, a batch type chamber, and the like. It is preferable that the chamber have a sealed structure, but it is not necessary to have a sealed structure. The water may be pure water, ultrapure water, and the like. The surface on which the water is supplied may be the front surface of the silicon wafer, or the both front and rear surfaces of the silicon wafer. Examples of a method of forming the water film may include to run water from a pipe nozzle to the wafer surface, to spray water on the surface, and the like.

The water film may have any thickness, as long as the film is thicker than a size (diameter) of the metal impurities and the microparticles. Since the size of the microparticles is 1 μm or less, the thickness of the water film is, for example, 0.5 to 100 μm. When the thickness is less than 0.5 μm, evenness of the water film cannot be ensured within the wafer surface. When the thickness exceeds 100 μm, the water film cannot be maintained evenly on the wafer front surface. A preferable thickness of the water film is 10 to 50 μm. Within the range, the evenness of the water film can be ensured within the wafer surface, and cleaning can be performed evenly within the wafer surface.

Examples of the oxidation gas (type) may include an ozone gas, an oxygen gas, and the like. A thickness of the silicon oxide film is 1 to 10 nm. When the thickness is less than 1 nm, a force to retain the water film on the wafer front surface is reduced, and thus evenness of the water film cannot be ensured. Forming an oxide film having a thickness of 10 nm or greater requires excessive facility in order to ensure capabilities of an oxide gas generator. A preferable thickness of the silicon oxide film is 0.3 to 6 nm. Within the range, further advantageous effects can be achieved, including maintenance of evenness of the water film and ensuring of cleaning performance. Examples of the metal impurities may include Na, K, Al, Ca, Cr, Fe, Ni, Cu, Zn, and the like. The microparticles (particles) may be substances having a particle size of several tens nm to 1 μm or less, regardless of material. The organic acid mist is produced by dissolving an organic acid into water. Any production method of the mist may be employed, including, for instance, to provide an organic acid solution in a mist form by using a mister, and then to mix with carrier gas such as $N_2$ and the like, for production.

A concentration of the organic acid in the organic acid mist is 10 to 10,000 $g/m^3$. When the concentration is less than 10 $g/m^3$, zeta potential of particles and the like existing in the water film, cannot be appropriately controlled. When the concentration exceeds 10,000 $g/m^3$, the component of the organic acid in the mist form itself is solidified, thus generating particles. A preferable concentration of the organic acid in the organic acid mist is 50 to 5,000 $g/m^3$. Within the range, further advantageous effects can be achieved, including that the wafer front surface can be treated in a state in which the zeta potential is appropriately controlled. A size (particle size) of droplets forming the mist is 1 to 1,000 μm. When the size is less than 1 μm, it is difficult to control the size of the mist itself. When the size exceeds 1,000 μm, the mist cannot appropriately be supplied by carrier gas. A preferable particle size of the droplets is 10 to 100 μm. Within the range, further advantageous effects can be achieved, including that the organic acid mist can appropriately be supplied by the carrier gas.

An order of the introduction of the organic acid mist and the HF gas to the chamber may be concurrent. Alternatively, either of the mist or the gas may be introduced first. To discharge the contaminated water film from the surface of the silicon wafer on which the water film is formed, a mainly employed method is, for example, to excessively supply (continuously supply) the organic acid mist, inasmuch as to exceed a surface tension of the water film. In addition to the method, other methods may be concurrently employed, including to spin-remove the film when the silicon wafer is placed on a rotation plate, and to spray inert gas, such as $N_2$ and the like, onto the wafer front surface. The oxidation gas supplied to the water film and the oxidation gas introduced in lieu of the organic acid mist may be the same material gas or different material gas. A thickness of the silicon oxide protection film is 1 to 10 nm. When the thickness is less than 1 nm, the force to retain the water film on the wafer front surface is reduced, and thus evenness of the water film cannot be ensured. Forming an oxide film having a thickness of 10 nm or greater requires excessive facility in order to ensure capabilities of an oxide gas generator. A preferable thickness of the silicon oxide film is 3 to 6 nm. Within the range, further advantageous effects can be achieved, including maintenance of evenness of the water film and ensuring of cleaning performance. According to the present invention, a plurality of types of chemical solutions may be dissolved in the water film formed on the silicon wafer surface for a desired treatment. As described above, preparing chemical solutions on the wafer surface prevents a conventional problem of attenuation of a gas component in a supply pipe.

A second aspect of the invention provides the method of cleaning the silicon wafer according to the first aspect, wherein the oxidation gas is an ozone gas.

According to the second aspect of the invention, the ozone gas is employed as the oxidation gas, and thus the oxidation gas can be obtained simply and affordably. In addition, a used solution does not need to be neutralized with a reductant. An ozone concentration in the water film is preferably 0.5 ppm or greater. When the ozone concentration is less than 0.5 ppm, it is difficult to form a hydrophilic oxide film on the silicon wafer surface, and a decomposition and removal function of the organic acid deposited on the silicon wafer surface is deteriorated. Since a dissolution limit of ozone to pure water is about 25 ppm, it is further preferable that the ozone concentration of ultrapure water film (dissolved ozone water film) be 2 to 25 ppm.

A third aspect of the invention provides the method of cleaning the silicon wafer according to the first or second aspect, wherein an organic acid contained in the organic acid mist is at least one type selected from a group consisting of oxalic acid, citric acid, succinic acid, ethylenediaminetetraacetic acid, tartaric acid, salicylic acid, formic acid, acetic acid, propionic acid, butyric acid, valeric acid, caproic acid, caprylic acid, lauric acid, myristic acid, palmitic acid, stearic acid, arachic acid, benzoic acid, acrylic acid, adipic acid, malonic acid, malic acid, glycolic acid, phthalic acid, terephthalic acid, pimelic acid, and fumaric acid. A salt of the above-listed organic acids (organic acid salt) may be employed. Among the organic acids, oxalic acid is most preferable because the zeta potential is most easily controlled.

A fourth aspect of the invention provides a silicon wafer cleaning apparatus including an openable/closable chamber in which a silicon wafer is placed; a water supplier supplying water to at least one of a front surface and a rear surface of the silicon wafer placed in the chamber, and thereby forming a water film; an oxidation gas introducer introducing an oxidation gas to the chamber, dissolving a component of the oxidation gas in the water film, causing an oxidation action on the surface of the silicon wafer on which the water film is formed, and thereby forming a silicon oxide film; a mist generator generating an organic acid mist; a mist introducer introducing the organic acid mist from the mist generator to the chamber; an HF gas introducer introducing an HF gas to the chamber, the HF gas dissolving the silicon oxide film in the water film; and a water film discharger discharging the water film from the surface of the silicon wafer on which the water film is formed.

According to the fourth aspect of the invention, the silicon wafer is placed in the chamber, and the water is supplied by the water supplier to form the water film at least on the front surface of the front and rear surfaces of the wafer. The oxidation gas is then introduced to the chamber by the oxidation gas introducer. Thereby, the component of the oxidation gas is dissolved in the water film; and thus the silicon oxide film is formed on the surface of the silicon wafer on which the water film is formed. Subsequently, the oxidation gas is stopped from being introduced, for example. The organic acid mist generated by the mist generator and the HF gas are then introduced concurrently or separately by the mist introducer and the HF gas introducer, respectively. Thus, the organic acid in a mist form and the HF in a gas form are contacted with the water film, and thus respective components are dissolved in the water film. As a result, the surface of the silicon wafer on which the water film is formed, and metal impurities and microparticles deposited on the surface are negatively charged. Zeta potential then removes the metal impurities and the microparticles from the wafer surface. Further, an HF etching function dissolves the silicon oxide film, and thereby removes the film from the wafer surface.

The HF gas is stopped from being introduced by the HF gas introducer into the chamber thereafter, for example, and only the organic acid mist is introduced. Then, while the status is maintained, the water film contaminated due to dissolution of the metal impurities, the microparticles, and the silicon oxide film, is discharged by the water film discharger, from the surface of the silicon wafer on which the water film is formed. Since the organic acid is continuously introduced to the water film at the time, it is unlikely that the metal impurities and the microparticles are deposited again on the wafer surface. After the discharge, a large amount of the organic acid mist is deposited on the wafer surface, and thus a new water film containing the organic acid is formed on the wafer surface. Then, the oxidation gas is introduced into the chamber by the oxidation gas introducer, in lieu of the organic acid mist; the component of the oxidation gas is dissolved in the organic acid water film; and thus the silicon oxide film (silicon oxide protection film) is formed on the surface of the silicon wafer on which the water film is formed. Thereby, a sufficient cleaning effect can be achieved by the cleaning components in the gas and the mist. Further, a concentration of the cleaning components in the water film within the wafer surface can be even. In addition, it is unlikely that unevenness in cleaning occurs. As the cleaning components, not only the component in the cleaning gas, but that in the cleaning mist can also be employed.

The water supplier may be a unit pumping water produced by a water producing apparatus, for instance. The oxidation gas introducer may be a unit pumping an oxidation gas discharged from an oxidation gas cylinder through a gas pipe, for instance. The mist generator may be a unit forming an organic acid solution into a mist in an ejector system. Alternatively, a unit may be employed in which an organic acid mist is generated as an organic acid solution is heated by a heater in a sealed tank. In this case, the organic acid solution evaporates to organic acid mist, and thus the organic acid mist can be obtained simply and affordably. A heating temperature of the organic acid by the heater is a temperate at which the organic acid evaporates. The mist introducer may be a unit supplying the organic acid mist generated by the mist generator, with carrier gas such as $N_2$ and the like, and spraying the mist from a nozzle provided in the chamber. The HF gas introducer may be a unit supplying the HF gas with carrier gas such as $N_2$ and the like, and spraying the gas from a nozzle provided in the chamber. Examples of the water film discharger may include an excess supplier (continuous supplier) of the organic acid mist, inasmuch as exceeding a surface tension of the water film; a spin remover in which the silicon wafer is placed on a rotation plate; and the like.

A fifth aspect of the invention provides the silicon wafer cleaning apparatus according to the fourth aspect, wherein the oxidation gas is an ozone gas.

A sixth aspect of the invention provides the silicon wafer cleaning apparatus according to the fourth or fifth aspect, wherein an organic acid contained in the organic acid mist is at least one type selected from a group consisting of oxalic acid, citric acid, succinic acid, ethylenediaminetetraacetic acid, tartaric acid, salicylic acid, formic acid, acetic acid, propionic acid, butyric acid, valeric acid, caproic acid, caprylic acid, lauric acid, myristic acid, palmitic acid, stearic acid, arachic acid, benzoic acid, acrylic acid, adipic acid, malonic acid, malic acid, glycolic acid, phthalic acid, terephthalic acid, pimelic acid, and fumaric acid.

Solubility of citric acid, salicylic acid, oxalic acid, phthalic acid, formic acid, malonic acid, succinic acid, and acetic acid, relative to water (water temperature of 10° C., 20° C., and 30° C.) is shown in Table 1. Vapor pressure of the respective organic acids at the water temperature of 10° C., 20° C., and 60° C. is shown in Table 2.

TABLE 1

|  | 10° C. | 20° C. | 30° C. |  |
|---|---|---|---|---|
| Citric acid | 54.2 | 59.4 | 64.6 | (Solute in 100 g of saturated solution; mass/g) |
| Salicylic acid | 0.12 | 0.19 | 0.28 | (Solute in 100 g of saturated solution; mass/g) |
| Oxalic acid | 5.731 | 8.69 | 12.46 | (Solute in 100 g of saturated solution; mass/g) |
| Phthalic acid | — | 0.571 | 1 | (Solute in 100 g of saturated solution; mass/g) |
| Formic acid | 75.8 | 77.1 | 78.2 | (Solute in 100 g of saturated solution; mass/g) |
| Malonic acid | 56.99 | 60 | 63 | (Solute in 100 g of saturated solution; mass/g) |
| Succinic acid | 4.5 | 6.9 | 10.6 | (g/100 mL-$H_2O$) |
| Acetic acid | ∞ | ∞ | ∞ | (Presence of liquid phase) |

TABLE 2

|  | 10° C. | 20° C. | 60° C. |  |
|---|---|---|---|---|
| Citric acid | — | — | — | (Not evaporate under ordinary pressure) |
| Salicylic acid | — | — | — | (Not evaporate under ordinary pressure) |
| Oxalic acid | — | — | — | (Not evaporate under ordinary pressure) |
| Phthalic acid | — | — | — | (Not evaporate under ordinary pressure) |
| Formic acid | −1.9 | 10.2 | 32.11 | (mmHg) |
| Malonic acid | — | — | — | (Not evaporate under ordinary pressure) |
| Succinic acid | — | — | — | (Not evaporate under ordinary pressure) |
| Acetic acid | 17.6 | 29.5 | 51.01 | (mmHg) |

According to the first and fourth aspects of the invention, the water film is first formed at least on the front surface of the silicon wafer in the chamber. Subsequently, to the water film, the oxidizing component of the oxidization gas, the organic acid component of the organic acid mist, the HF component of the HF gas, the organic acid mist, and the oxidation gas component of the oxidation gas are sequentially supplied, while the gas in the chamber is replaced. Thereby, a sufficient cleaning effect of the wafer surface is achieved by the HF component and the organic acid component. Further, the concentration of the cleaning components in the water film within the wafer surface can be even. It is thus unlikely that unevenness in cleaning occurs on the cleaned surface of the silicon wafer. The effects above can be achieved regardless of the wafer size (for example, a large diameter wafer of 300 mm or greater). In addition, the cleaning components may be employed not only from the cleaning gas, but also from the cleaning mist.

According to the second and fifth aspects of the invention in particular, the ozone gas is employed as the oxidation gas. The oxidation gas can thus be obtained simply and affordably. In addition, a used solution does not need to be neutralized with a reductant.

Figure 1:
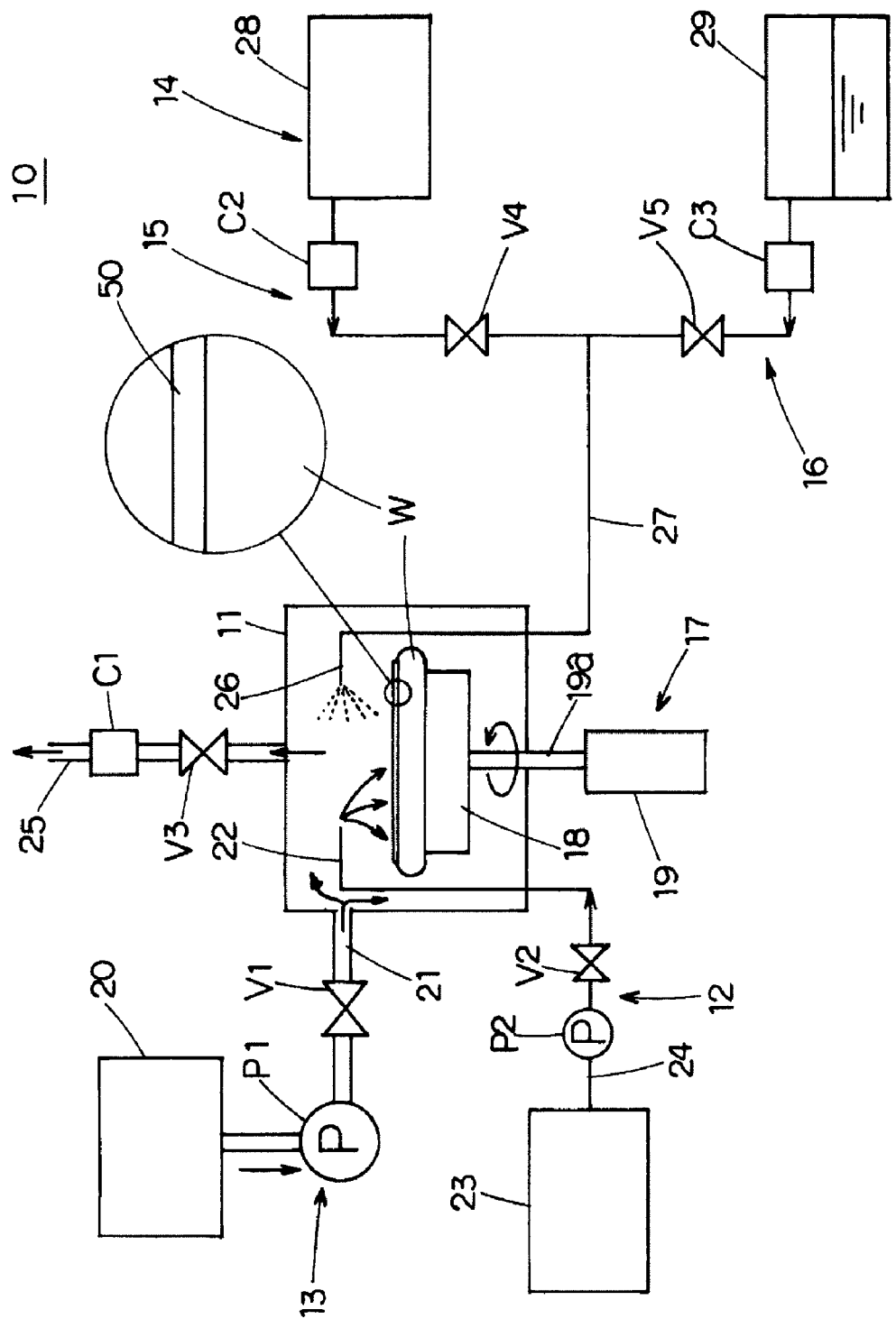
FIG. 1 illustrates an entire structure of a silicon wafer cleaning apparatus according to a first embodiment of the present invention.

10 Silicon wafer cleaning apparatus
11 Chamber
12 Water supplier
13 Oxidation gas introducer
14 Mist generator
15 Mist introducer
16 HF gas introducer
50 Water film
W Silicon wafer

DETAILED DESCRIPTION OF PREFERRED EMBODIMENTS

The embodiments of the present invention are specifically explained below.

First Embodiment

In FIG. 1, a silicon wafer cleaning apparatus 10 has a single-wafer type sealable chamber 11 in which a polished silicon wafer W is placed; a water supplier 12 supplying water on a front surface of the silicon wafer W placed in the chamber 11, and thereby forming a water film 50; an ozone gas introducer (oxidation gas introducer) 13 introducing an ozone gas (oxidation gas) to the chamber 11, dissolving an ozone component in the water film 50, and thereby forming a silicon oxide film on the front surface (surface on which the water film is formed) of the silicon water W; a mist generator 14 generating an oxalic acid mist (organic acid mist); a mist introducer 15 introducing the oxalic acid mist from the mist generator 14 to the chamber 11; an HF gas introducer 16 introducing an HF gas into the chamber 11, the HF gas dissolving the silicon oxide film in the water film 50; and a water film discharger 17 discharging the water film 50 from the front surface of the silicon water W.

The chamber 11 is provided with an openable/closable outlet/inlet for the silicon wafer W. A turntable 18 is provided in a middle portion of the chamber 11, the turntable 18 vacuum-suctioning a rear surface of the silicon wafer W. An end portion of an output axis 19a of a rotation motor 19 is fixedly attached to a lower surface of a middle portion of the turntable 18, the rotation motor 19 being provided below the middle portion of the chamber 11. When the output axis 19a is rotated by the rotation motor 19, the silicon wafer W is rotated along with the turntable 18 at a predetermined rate of rotation.

A front portion of a gas pipe 21 is connected to a first side wall of the chamber 11, the gas pipe 21 having a base portion connected to a gas discharger of an ozone gas generator 20. Along the gas pipe 21, a pump P1 and an open/close valve V1 are provided in order from an upstream side with a distance in between. Further, a water supply nozzle 22 is provided to a first side portion of an upper space in the chamber 11. A front end portion of a water supply pipe 24 is connected to a base portion of the supply nozzle 22, the water supply pipe 24 having a base portion connected to a water discharger of a ultrapure water producer 23. Along the water supply pipe 24, a pump P2 and an open/close valve V2 are provided in order from an upstream side with a distance in between.

Figure 3:
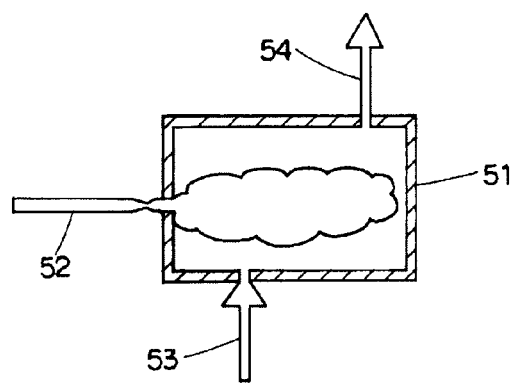
FIG. 3 is a cross-sectional view of a mist generator incorporated in the silicon wafer cleaning apparatus according to the first embodiment of the present invention.

A gas discharge pipe 25 discharging gas in the chamber 11 is provided in a middle portion of an upper wall in the chamber 11. Along the gas discharge pipe 25, an open/close valve V3 and a purge compressor C1 are provided in order from an upstream side. A spray nozzle 26 is provided to a second side portion of the upper space in the chamber 11, the spray nozzle 26 spraying a gas phase mixture of the oxalic acid mist and the HF gas. A front end portion of a gas phase pipe 27 having a two-pronged base portion is connected to a base portion of the spray nozzle 26. A first prong of the base portion of the gas phase pipe 27 is connected to an upper space of a sealed tank 28, which is a main body of the mist generator 14. A second prong of the base portion of the gas phase pipe 27 is connected to an upper space of a sealed-type HF gas generation tank 29. The mist generator 14 has an ejector container 51, which is connected with a chemical solution supply pipe 52 to which an oxalic acid solution is supplied; a supply pipe 53 of a nitrogen gas as carrier gas; and a mist discharge pipe 54 having a small diameter (FIG. 3). To the first prong of the base portion of the gas phase pipe 27, a compressor C2 and an open/close valve V4 are provided in order from an upstream side with a distance in between. Further, to the second prong of the base portion of the gas phase pipe 27, a compressor C3 and an open/close valve V5 are provided in order from an upstream side with a distance in between.

The water supplier 12 has the supply nozzle 22, the water supply pipe 24, the pump P2, and the open/close valve V2. The ozone gas introducer 13 has the gas pipe 21, the pump P1, and the open/close valve V1. The mist introducer 15 has the spray nozzle 26, the gas phase pipe 27, the compressor C2, and the open/close valve V4. The HF gas introducer 16 has the spray nozzle 26, the gas phase pipe 27, the compressor C3, and the open/close valve V5. The water film discharger 17 has the rotation motor 19.

Figure 2:
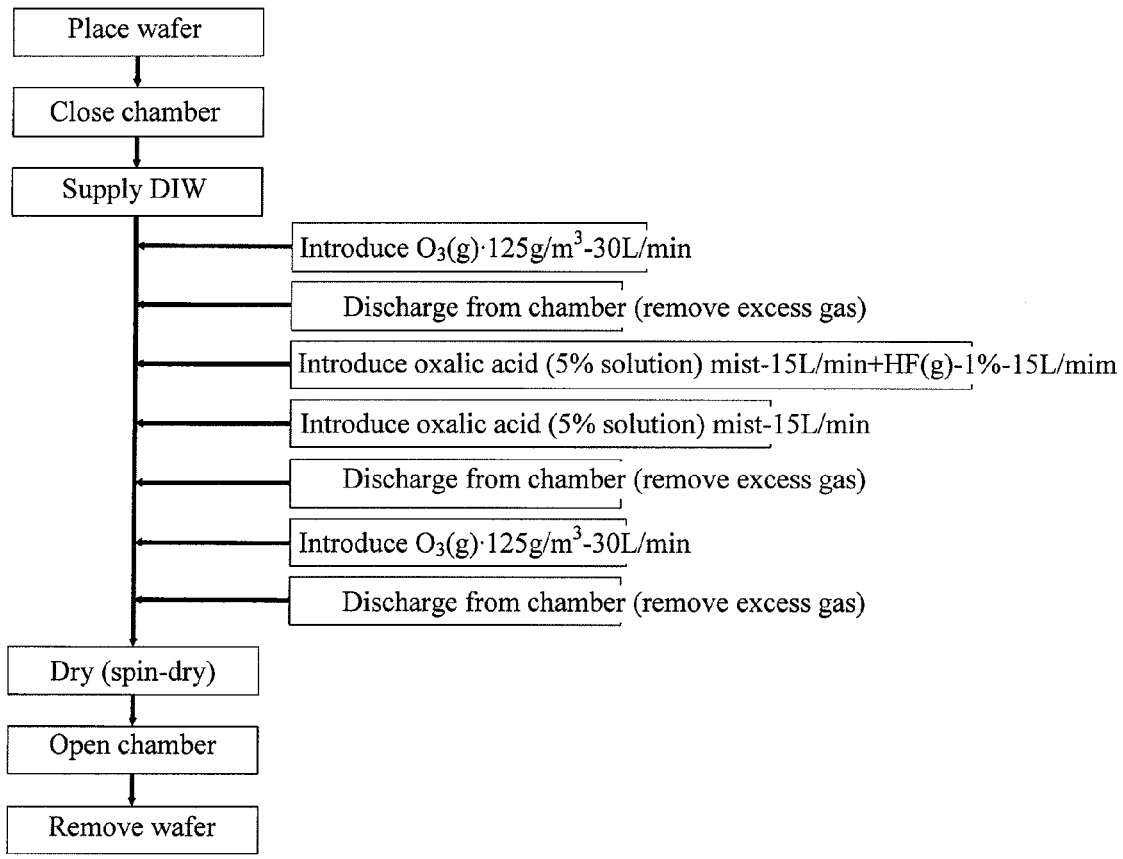
FIG. 2 is a flow sheet illustrating a method of cleaning a silicon wafer according to the first embodiment of the present invention.

A method of cleaning a silicon wafer using the silicon wafer cleaning apparatus 10 according to the first embodiment is explained below with reference to a flow sheet of FIG. 2. First, all the open/close valves V1 to V5 are closed, and the outlet/inlet of the chamber 11 is opened. The silicon wafer W is vacuum-suctioned on the turntable 18. The outlet/inlet of the chamber 11 is then tightly closed. The silicon wafer W and the turntable 18 are integrally rotated by the rotation motor 19 at a rate of 100 rpm. Subsequently, the open/close valve V2 is opened, and the pump P2 is activated. Water produced by the ultrapure water producer 23 is then flown out to the front surface of the rotating silicon wafer W from the water supply nozzle 22. Thereby, the water film 50 having a thickness of 30 μm is formed on the front surface of the silicon wafer W. The rotation of the turntable 18 by the rotation motor 19 is then stopped. The open/close valve V2 is closed, and the pump P2 is deactivated.

Subsequently, the open/close valve V1 is opened, and the pump P1 is activated. An ozone gas (125 g/m$^3$) is then generated and introduced by the ozone gas generator 20 to the chamber 11 at a rate of 30 liter/minute for 1 minute. Thereby, ozone in the ozone gas is dissolved in the water film 50, and thus a silicon oxide film is formed on the front surface of the silicon wafer W. Subsequently, the pump P1 is deactivated, and the open/close valve V1 is closed; and the compressor C1 is activated, and the open/close valve V3 is opened. An excess ozone gas in the chamber 11 is then purged. Thereafter, the compressor C1 is deactivated, and the open/close valve V3 is closed; and the both compressors C2 and C3 are activated, and the both open/close valves V4 and V5 are opened. Thereby, a gas phase mixture of the oxalic acid mist generated by the mist generator 14 and the HF gas (HF: 1%) obtained from the HF gas generation tank 29 is sprayed (concurrently introduced) into the chamber 11 at a rate of 15 liter/minute from the spray nozzle 26 through the gas phase pipe 27. In the mist generator 14, a nitrogen gas as carrier gas is injected at a high pressure into the ejector container 51, and the nitrogen gas is discharged at a high rate from the small-diameter mist discharge pipe 54. At the time, an inside of the ejector container 51 is under negative pressure, into which the oxalic acid is suctioned in a mist form from the chemical solution supply pipe 52. Thus, the oxalic acid solution is evaporated to an oxalic acid mist. Employing the system described above allows simple and affordable production of the oxalic acid mist.

Thereby, the oxalic acid in the mist form and the HF in the gas form are contacted on the water film 50, and then the both components are dissolved in the water film 50. As a result, the front surface of the silicon water W, and metal impurities and microparticles deposited on the surface are negatively charged. Zeta potential then removes the metal impurities and the microparticles from the wafer surface. The metal impurities transferred into the water film 50 form a complex with molecules of the oxalic acid. Complex ions of the metal complex salt are also negative, similar to surface potential of the silicon wafer W. Thus, the metal impurities transferred into the solution are not deposited again on the silicon wafer W, whose surface potential is negative. Further, an HF etching function dissolves the silicon oxide film, and thus removes the film from the wafer surface.

Thereafter, the compressor C3 is deactivated, and the open/close valve V5 is closed. The introduction of HF gas into the chamber 11 is then stopped, thus switching to the introduction of the organic acid mist only (same introduction amount). While the status is maintained, the water film 50, which is contaminated with the dissolved metal impurities, microparticles, and silicon oxide film, is discharged from the front surface of the silicon wafer W. At the time of discharge, the open/close valve V2 is first opened, and the pump P2 is activated. The water produced by the ultrapure water producer 23 is then flown out to the front surface of the rotating silicon wafer W from the water supply nozzle 22. The turntable 18 is subsequently rotated by the rotation motor 19 at a rate of 100 rpm for 1 minute. Thereafter, the rotation of the turntable 18 by the rotation motor 19 is stopped. The open/close valve V2 is closed, and the pump P2 is deactivated. At the time, the introduction of the oxalic acid to the water film 50 is continuously performed. Thus, it is unlikely that the metal impurities and the microparticles are deposited again on the wafer surface, because of the reasons described above.

Subsequently, the open/close valve V4 is closed, and the compressor C2 is deactivated. The supply of the oxalic acid mist is thus stopped. Then, the compressor C1 is activated again, and the open/close valve V3 is opened. An excess oxalic acid mist in the chamber 11 is then purged. Thereafter, the open/close valve V2 is opened, and the pump P2 is activated. Thereby, the water produced by the ultrapure water producer 23 is flown out to the front surface of the rotating silicon wafer W from the water supply nozzle 22. Then, the turntable 18 is rotated by the rotation motor 19 at a rate of 100 rpm for 1 minute. Thereafter, the rotation of the turntable 18 by the rotation motor 19 is stopped. The open/close valve V2 is closed, and the pump P2 is deactivated. Subsequently, the pump P1 is activated again, and the open/close valve V1 is opened. The ozone gas (125 g/m$^3$) generated by the ozone gas generator 20 is then supplied to the chamber 11 at a rate of 30 liter/minute for 1 minute. Thereby, ozone is dissolved in the water film 50 (organic acid water film), and thus a silicon oxide protection film is formed on the front surface of the silicon wafer W. Thereafter, the pump P1 is deactivated, and the open/close valve V1 is closed; and the compressor C1 is activated again, and the open/close valve V3 is opened. An excess ozone gas in the chamber 11 is then purged. Subsequently, the turntable 18 is rotated by the rotation motor 19 at a rate of 1,500 rpm for 1 minute. The front surface of the silicon wafer W is thus spin-dried. Thereafter, the outlet/inlet of the chamber 11 is opened, and then the silicon wafer W is removed.

Cleaning the silicon wafer W as described above achieves a sufficient cleaning effect by the cleaning components in the gas and the mist. Concurrently, a concentration of the cleaning components in the water film 50 within the wafer surface can be even. Thus, unevenness in cleaning can be prevented. As the cleaning components, not only the HF in the HF gas, but the oxalic acid in the oxalic acid mist can also be employed. Further, the ozone gas is employed as the oxidation gas, and thus the oxidation gas is obtained simply and affordably. In addition, a used solution does not need to be neutralized with a reductant.

Results are reported below of LPD (light point defect) evaluation and haze evaluation, performed on silicon wafers cleaned in the method of cleaning the silicon wafer according to the first embodiment (present invention), a conventional batch cleaning method (comparative example 1), and a conventional gas-type single-wafer cleaning method (comparative example 2). The silicon wafers used herein were wafers exposed and contaminated in a clean room, the wafers having 1,000 pcs of microparticles having a particle size of 65 nm deposited on a wafer front surface. In comparative example 1, a polished silicon wafer was immersed in ozone water of 10 ppm for 4 minutes. Thereafter, the silicon wafer was immersed in a mixed solution of 0.05% HF and 0.01% oxalic acid. Then, the silicon wafer was immersed in a 0.01% oxalic acid solution for 4 minutes, immersed in ozone water of 10 ppm for 4 minutes, and then spin-dried.

In comparative example 2, in lieu of the supply of the oxalic acid mist and the HF gas into the chamber, and the supply of only the oxalic acid mist into the chamber immediately thereafter in the method of cleaning the silicon wafer of the first embodiment, an HF gas having 1% HF was introduced into the chamber at a rate of 15 liter/minute. Other than the above processes, the silicon wafer W was cleaned in the same manner as in the first embodiment. Results are shown in Table 3. In Table 3, 65 nm and 120 nm represent the particle size of microparticles.

TABLE 3

|  | 65 nm | 120 nm |
|---|---|---|
| First embodiment | 10.4 | 2.1 |
| Comparative example 1 | 9.7 | 2.3 |
| Comparative example 2 | 20.3 | 3.1 |

(pcs/wf)

As demonstrated in Table 3, LPD removal performance was similar in the first embodiment and comparative example 1 (batch cleaning). The LPD removal performance was inferior, however, in comparative example 2 (gas-type single wafer cleaning) to that in the first example and comparative example 1.

Figure 4:
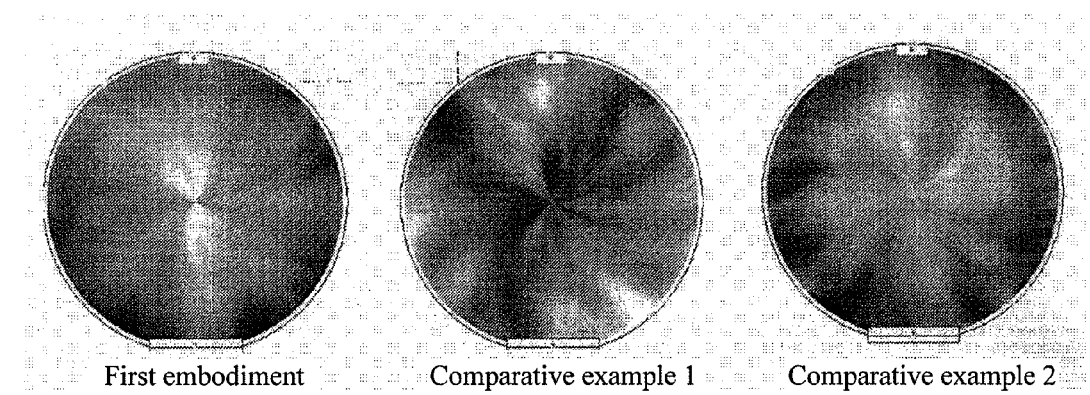
FIG. 4 is a front view illustrating results of haze evaluation of silicon wafers obtained in the method of cleaning the silicon wafer according to the first embodiment of the present invention and in a conventional method.

For haze evaluation, deteriorated areas (white image portions) appeared locally in comparative example 1, as shown in FIG. 4. In the first embodiment and comparative example 2, results were good demonstrating an even distribution from a wafer middle portion.

The present invention is effective in cleaning silicon wafers, such as mirror-polished wafers, epitaxial wafers, SOI wafers, and the like.

What is claimed is:

1. A method of cleaning a silicon wafer comprising:
forming a water film by vacuum-suctioning a silicon wafer to a turntable provided in a sealed chamber and supplying water to a front surface of the silicon wafer;
forming a silicon oxide film on the front surface of the silicon wafer subsequent to the forming of the water film by stopping the supply of water, supplying an oxidation gas to the chamber, and dissolving the oxidation gas in the water film;
introducing gas subsequent to the forming of the silicon oxide film by stopping the supply of the oxidation gas, and either separately or concurrently supplying an organic acid mist and an HF gas to the chamber, negatively charging metal impurities and microparticles existing in the silicon oxide film, and dissolving the silicon oxide film in the water film;
discharging the water film in which the silicon oxide film is dissolved from the surface of the silicon wafer on which the water film is formed subsequent to the introduction of the gas, by stopping the supply of the HF gas, supplying the organic acid mist to the chamber, and rotating the turntable; and forming a protection film subsequent to the discharging, by stopping the supply of the organic acid mist, supplying water to the chamber to form a water film again on the front surface of the silicon wafer, subsequently stopping the supply of water and supplying an oxidation gas to the chamber to dissolve a component of the oxidation gas in the water film, and forming a silicon oxide film on the front surface of the silicon wafer.

2. The method of cleaning the silicon wafer according to claim 1, wherein the oxidation gas is an ozone gas.

3. The method of cleaning the silicon wafer according to claim 1, wherein an organic acid contained in the organic acid mist is oxalic acid.

4. The method of cleaning the silicon wafer according to claim 2, wherein an organic acid contained in the organic acid mist is oxalic acid.

* * * * *